United States Patent
Yu et al.

(10) Patent No.: US 6,560,761 B1
(45) Date of Patent: May 6, 2003

(54) METHOD OF DATAPATH CELL PLACEMENT FOR BITWISE AND NON-BITWISE INTEGRATED CIRCUIT DESIGNS

(75) Inventors: Qiong J. Yu, San Jose, CA (US); Alexander Tetelbuam, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 29 days.

(21) Appl. No.: 09/823,184

(22) Filed: Mar. 29, 2001

(51) Int. Cl.$^7$ ................................................. G06F 9/45
(52) U.S. Cl. ................................................ 716/10; 716/12
(58) Field of Search ........................................ 716/1–18

(56) References Cited

U.S. PATENT DOCUMENTS

| | | | | |
|---|---|---|---|---|
| 5,519,627 A | * | 5/1996 | Mahmood et al. | 716/17 |
| 5,586,047 A | * | 12/1996 | Imahashi | 716/18 |
| 5,657,243 A | * | 8/1997 | Toyonaga et al. | 716/11 |
| 5,737,237 A | * | 4/1998 | Tanaka et al. | 716/8 |
| 5,838,583 A | * | 11/1998 | Varadarajan et al. | 716/12 |

* cited by examiner

Primary Examiner—Tuan T. Lam
Assistant Examiner—Quan Tra
(74) Attorney, Agent, or Firm—Fitch, Even, Tabin & Flannery

(57) ABSTRACT

A method of datapath cell placement is disclosed that minimizes signal propagation time through a datapath macro and datapath macro area that includes the steps of receiving as input a datapath description for a datapath block wherein the datapath description describes at least one of a plurality of datapath cells, a plurality of data input pins, a plurality of data output pins, and a plurality of control signal pins; sorting the plurality of data input pins and the plurality of data output pins according to a hierarchy of sorting criteria; determining a plurality of corresponding criticality values for the plurality of datapath cells; sorting the plurality of datapath cells according to the plurality of corresponding criticality values; assigning the plurality of datapath cells to a plurality of corresponding columns; and arranging the plurality of datapath cells within at least one of the plurality of corresponding columns to minimize signal propagation delay through the datapath block.

10 Claims, 5 Drawing Sheets

US 6,560,761 B1

METHOD OF DATAPATH CELL PLACEMENT FOR BITWISE AND NON-BITWISE INTEGRATED CIRCUIT DESIGNS

BACKGROUND OF THE INVENTION

The present invention relates generally to design tools for integrated circuits. More specifically, but without limitation thereto, the present invention relates to a method of placing datapath cells within a datapath macro to minimize signal propagation time and datapath macro area.

Integrated circuits typically include datapath macros. A datapath macro is an arrangement of datapath blocks connected by data buses and control signals. The data buses are generally routed orthogonally to the control signals. Each datapath block contains one or more datapath cells. Each of the datapath cells are connected to one or more of the data buses and to one or more of the control signals. As the size and complexity of the datapath macros and constituent datapath blocks increases, it becomes increasingly difficult for cell placement tools to arrange the datapath cells so that the signal propagation time through the datapath macro and the area of the datapath macro are minimized under complex input constraints imposed on the placement of cells, pins, nets, gaps between cells, and so on. As the size and complexity of the datapath macros and constituent datapath blocks increases, therefore, signal propagation time through the datapath macro and the area of the datapath macro may be not be optimally minimized.

SUMMARY OF THE INVENTION

The present invention advantageously addresses the problems above as well as other problems by providing a method of datapath cell placement that minimizes signal propagation time and datapath macro area.

In one embodiment, the present invention may be characterized as a method of datapath cell placement that includes the steps of receiving as input a datapath description for a datapath block wherein the datapath description describes at least one of a plurality of datapath cells, a plurality of data input pins, a plurality of data output pins, and a plurality of control signal pins; sorting the plurality of data input pins and the plurality of data output pins according to a hierarchy of constraint criteria; determining a plurality of corresponding criticality values for the plurality of datapath cells; sorting the plurality of datapath cells according to the plurality of corresponding criticality values; assigning the plurality of datapath cells to a plurality of corresponding columns; and arranging the plurality of datapath cells within at least one of the plurality of corresponding columns to minimize signal propagation delay through the datapath block.

BRIEF DESCRIPTION OF THE DRAWINGS

The above and other aspects, features and advantages of the present invention will be more apparent from the following more specific description thereof, presented in conjunction with the following drawings wherein.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

Figure 1:
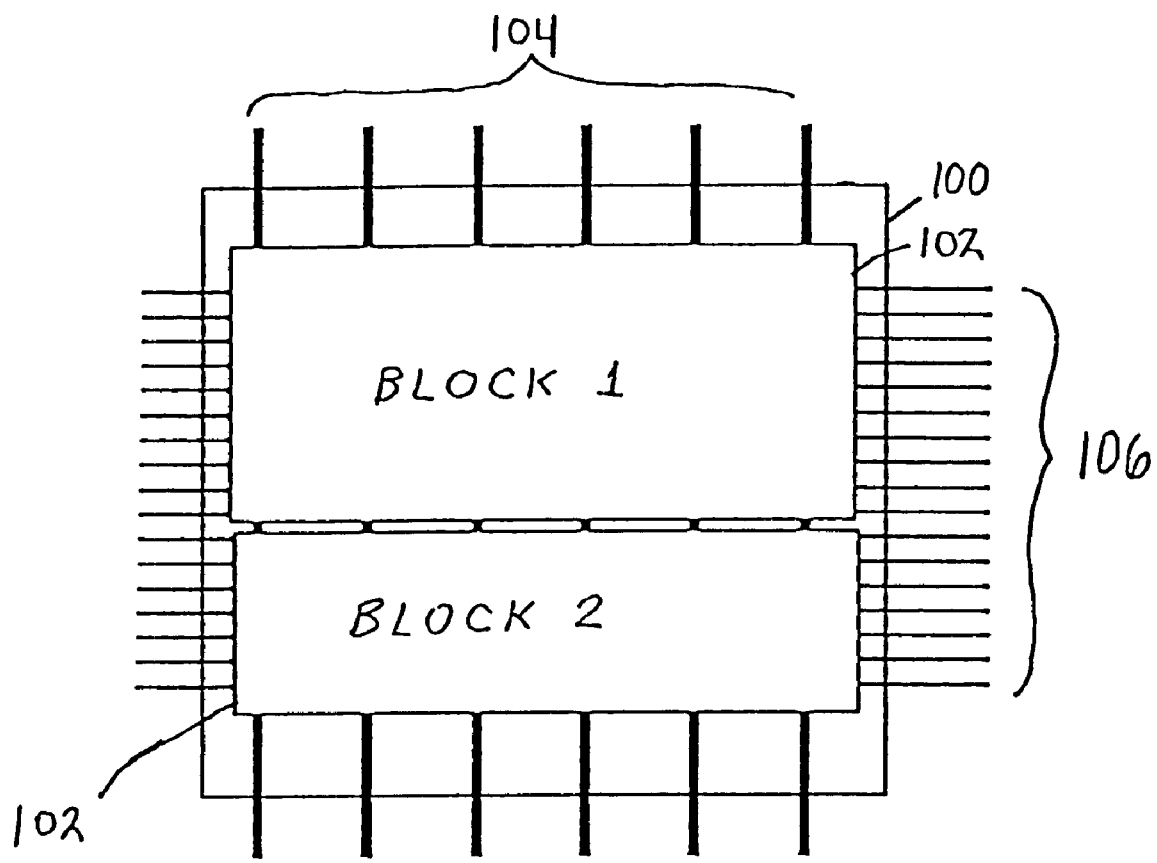
FIG. 1 is a diagram of a typical datapath macro structure of the prior art.

FIG. 1 is a diagram of a typical datapath macro structure 100 of the prior art. Shown in FIG. 1 are data blocks 102, data buses 104, and control signals 106. In this example, the datapath macro contains only two data blocks 102, however, more complex datapath macros may contain more. The data buses 104 are generally routed vertically through the data path macro 100, while the control signals 106 are generally routed horizontally. The data blocks 102 are arranged to include some or all of the data buses 102 and the control signals 104, depending on the functional requirements of each of the data blocks 102.

Figure 2:
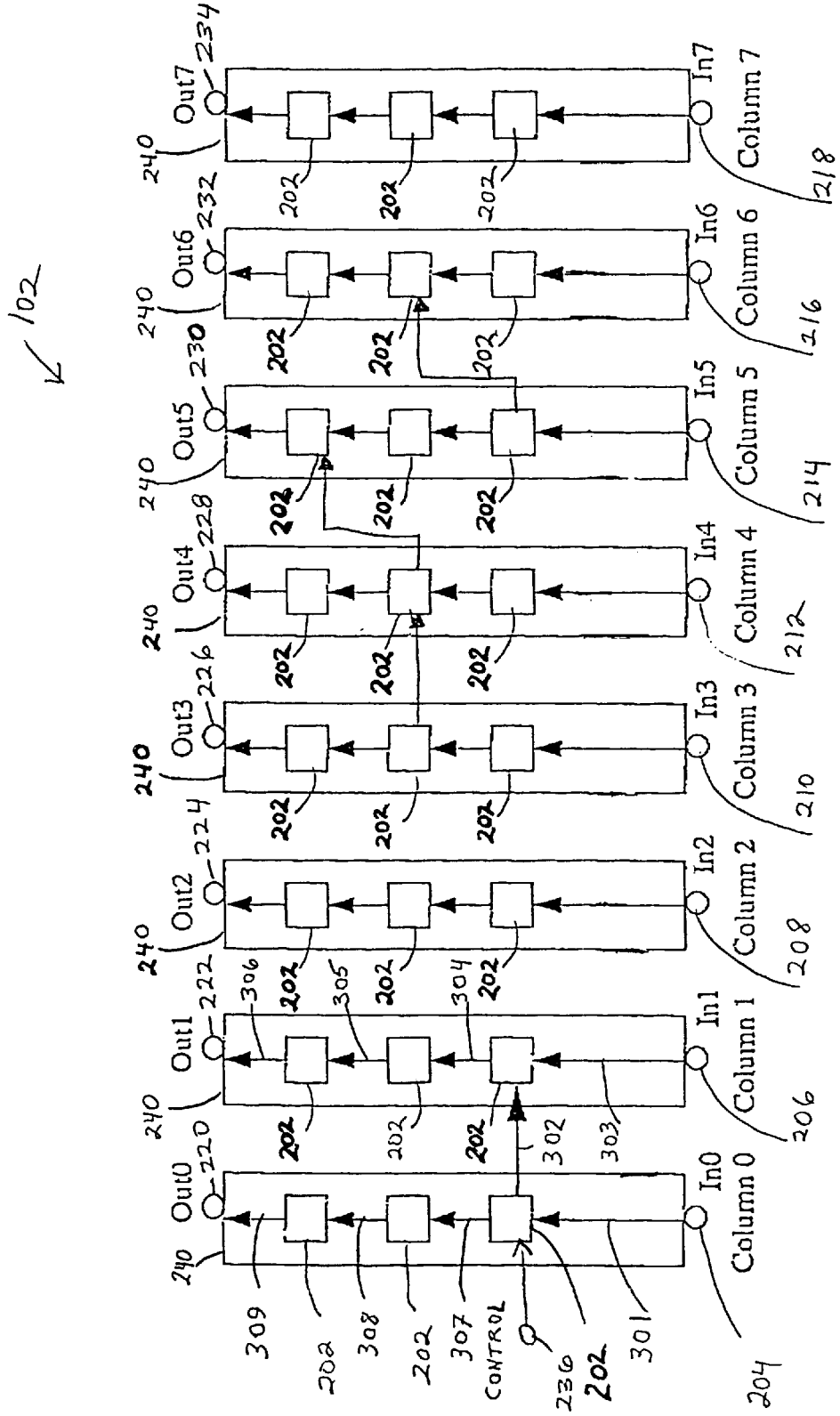
FIG. 2 is a diagram illustrating columns of datapath cells within a datapath block of FIG. 1 for a non-bitwise integrated circuit design.

FIG. 2 is a diagram illustrating columns of datapath cells within a datapath block 102 of FIG. 1 for a non-bitwise integrated circuit design. Shown in FIG. 2 are datapath cells 202, data input pins 204, 206, 208, 210, 212, 214, 216, and 218; data output pins 220, 222, 224, 226, 228, 230, 232, and 234; a control signal input 236, columns 240, and path legs 301, 302, 303, 304, 305, 306, 307, 308, and 309.

The datapath cells 202, data input pins 204–218, data output pins 220–234, and the control signal input 236 are defined for the datapath block 102 by a datapath description according to well known techniques. The data input pins 204–218 and data output pins 220–234 are also referred to collectively herein as cluster pins. A cluster pin that is assigned a constraint is a constrained cluster pin. Examples of constraints are the path length to which a cluster pin may be constrained, the column to which a cluster pin may be constrained, and the side location to which a cluster pin may be constrained. The constrained cluster pins of the datapath block 102 are sorted according to a hierarchy of constraint criteria such as the examples given above.

For example, the path length for each constrained cluster pin may be obtained by traversing the longest logical net along the corresponding signal propagation path between the constrained cluster pin and counting the path legs in either the forward direction or the backward direction. In this example, the path length for the data input pin 204 is obtained by traversing the longest corresponding signal propagation paths in the forward direction and counting the five path legs 301, 302, 303, 305, and 306 from the data input pin 204, and the path length for the data input pin 206 is obtained by counting the four path legs 303, 304, 305, and 306 from the data input pin 206. The path length of the data output pin 220 is obtained by traversing the longest corresponding signal propagation path in the backward direction and counting the four path legs 309, 308, 307, and 301, and the path length of the data output pin 222 is obtained by counting the five path legs 306, 305, 304, 302, and 301. Each path leg is a part of the signal propagation path of a cluster pin. During sorting, the constrained cluster pins are ordered according to their corresponding path length. For example, a constrained cluster pin having a longer path length may be ordered before a constrained cluster pin having a shorter path length.

The constrained cluster pins having the same path length are then sorted by column constraints. For example, a constrained cluster pin constrained to a lower column number may be ordered before a constrained cluster pin constrained to a higher column number. During sorting, the constrained cluster pins having the same path length are ordered according to the number of the column 240 to which each of the constrained cluster pins is constrained. In this example, the lowest column number 0 represents the leftmost column 240 of the datapath block 102.

The constrained cluster pins having the same path length and the same column constraint are then sorted by side constraints on the pin location. For example, a constrained cluster pin constrained to the top may be ordered before a constrained cluster pin constrained to the bottom. After sorting, the constrained cluster pins having the same path length, the same column constraint, and the same side constraint are ordered by pin number.

After the constrained cluster pins have been sorted according to the hierarchy of constraint criteria as illustrated in the example above, the datapath cells 202 are sorted according to their criticality values. The criticality value of a datapath cell 202 is defined as the number of intervening datapath cells 202 from the datapath cell 202 to the corresponding constrained cluster pin. Once the criticality value of each of the datapath cells 202 is determined, the datapath cells are sorted in order of criticality value. If two or more datapath cells 202 have the same criticality value, they are given the same order as the order between two constrained cluster pins along the shortest corresponding signal propagation paths of the datapath cells 202 as described above. The datapath cells that are not connected to constrained data input pins are assigned the lowest criticality value of zero.

In the example described above, the path length represents the first level of the hierarchy of constraint criteria, the column constraint represents the second level, and the side constraint represents the third level. Other constraint criteria and ordering of levels within the hierarchy of constraint criteria may be implemented for sorting the constrained cluster pins according to well known techniques to suit specific applications.

The sorted datapath cells 202 are then each assigned to one of the columns 240 to ensure that the placement of the datapath cells 202 is driven by the constrained cluster pins. The selection of a column 240 is made by first selecting possible candidate columns for each datapath cell 202. Candidate columns are those columns corresponding to constrained cluster pins that are directly connected to the datapath cell 202. For datapath cells 202 that are not connected directly to the constrained cluster pins, the candidate columns are the columns between the minimum and the maximum columns specified by all the column constraints. If there are no column constraints, then all the columns 240 in the datapath block 102 are candidate columns.

A weighted sum of the candidate column height and the total distance between the candidate column and all other columns connected to the datapath cell 202 is calculated for each candidate column. The weighting is determined by an examination of typical datapath designs. The datapath cell 202 is then assigned to the candidate column having the lowest weighted sum.

After assigning each of the datapath cells 202 to a column 240, the datapath cells are placed according to, for example, the distance of each datapath cell 202 from the constrained cluster pins. This step ensures that the order of datapath cells 202 inside each of the columns 240 is optimized for minimizing signal propagation delay through the datapath block 102.

Figure 3:
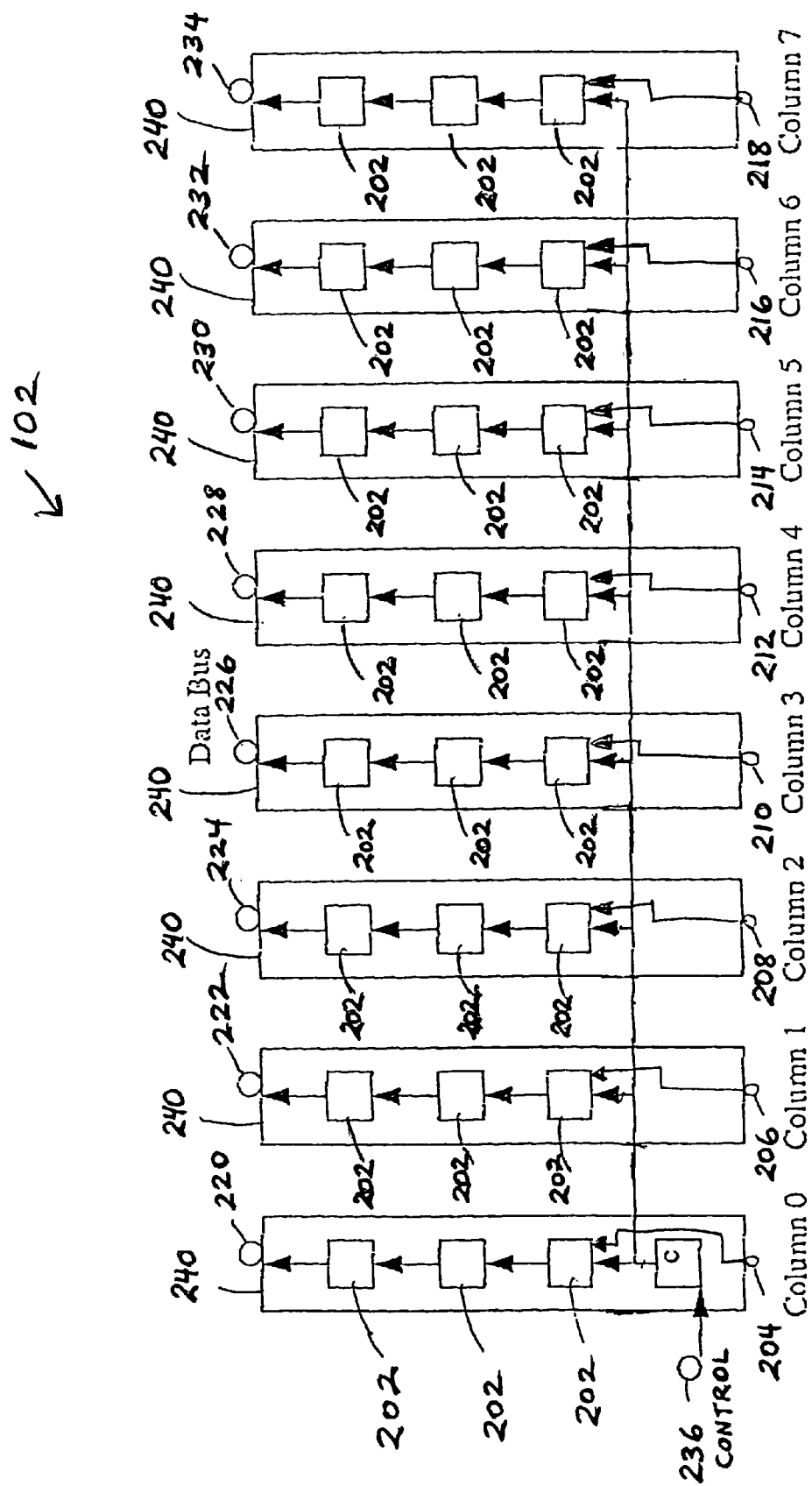
FIG. 3 is a diagram illustrating columns of datapath cells within a datapath block of FIG. 1 for a bitwise integrated circuit design.

FIG. 3 is a diagram illustrating columns of datapath cells and constrained data input pins within the datapath macro 100 of FIG. 1 for a bitwise integrated circuit design. Shown in FIG. 3 are datapath cells 202, data bus lines 220, 222, 224, 226, 228, 230, 232, and 234; a control signal input 236, and columns 240.

To determine whether an integrated circuit design is a bitwise design, an input logical pin bus of the maximum size among the input pin buses of the logical module associated with the datapath block is selected. The logical pins of the selected bus are traversed in the forward direction to the data output logical pins of the logical module. If these data output logical pins form a bus in the same order or in reverse order, then the datapath block has a bitwise design. If not, datapath block has a non-bitwise design.

For bitwise designs, a special rule is used in which the assigned column for each datapath cell 202 directly connected to a constrained cluster pin is the column 240 to which the constrained cluster pin is constrained. For each of the other datapath cells 202, the assigned column is the column 240 in which a corresponding candidate datapath cell 202 has been placed that lies in the path between the datapath cell 202 to be placed and a constrained cluster pin whose constraint was used to place the corresponding candidate datapath cell 202. This rule is applied to avoid the effect of control signals from unconstrained cluster pins on the placement of datapath cells 202 in the columns 240. For example, in FIG. 3, the datapath cell 202 labeled "C" is placed in column 240 labeled "Column 0". Although this datapath cell 202 is connected to a datapath cell 202 in each of the other columns 240, the assignment of the other datapath cells to columns 240 is not affected by the assignment of the datapath cell 202 labeled "C" to Column 0.

Figure 4A:
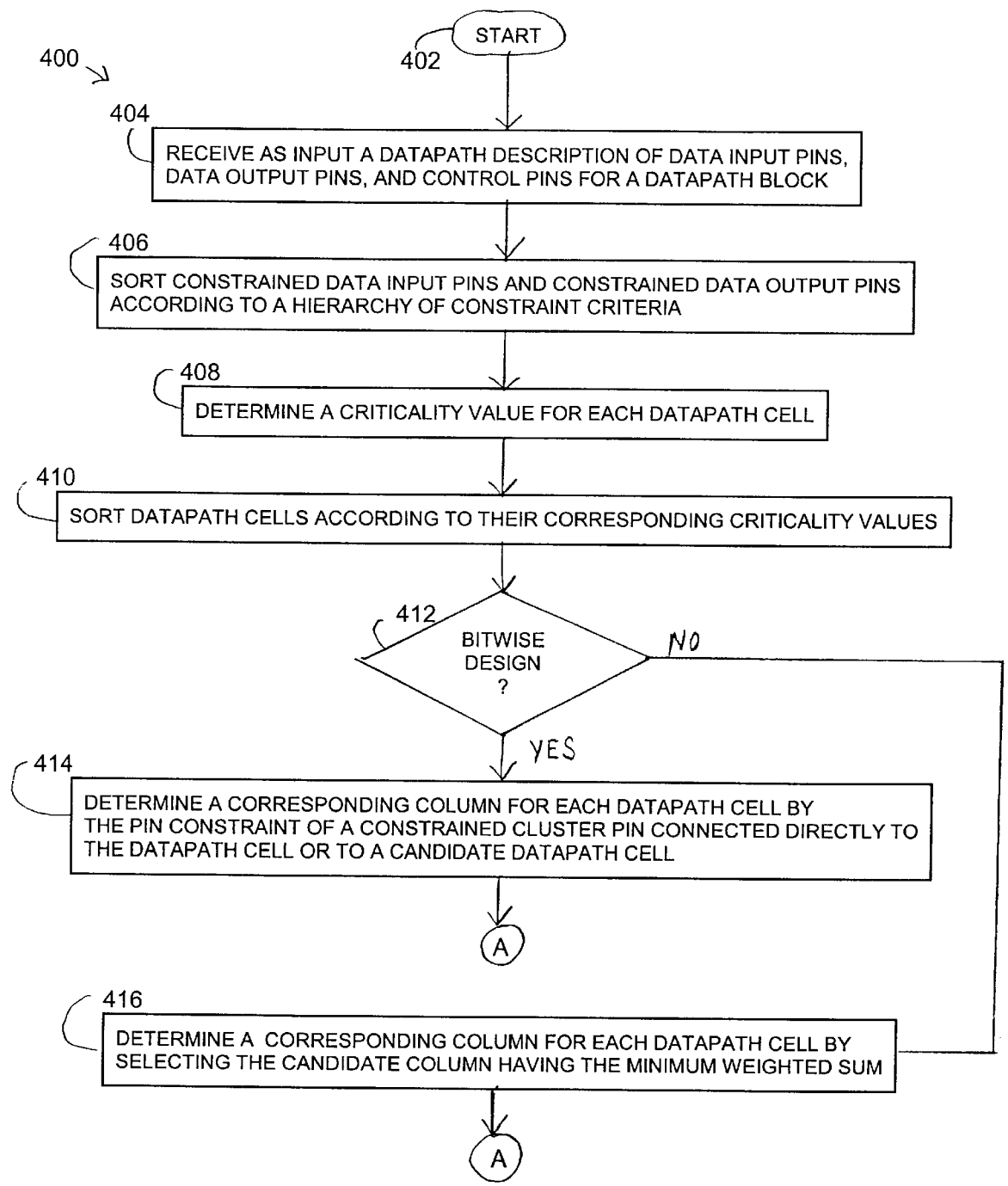
FIGS. 4A and 4B are a flowchart of a method of datapath cell placement according to an embodiment of the present invention.
Figure 4B:
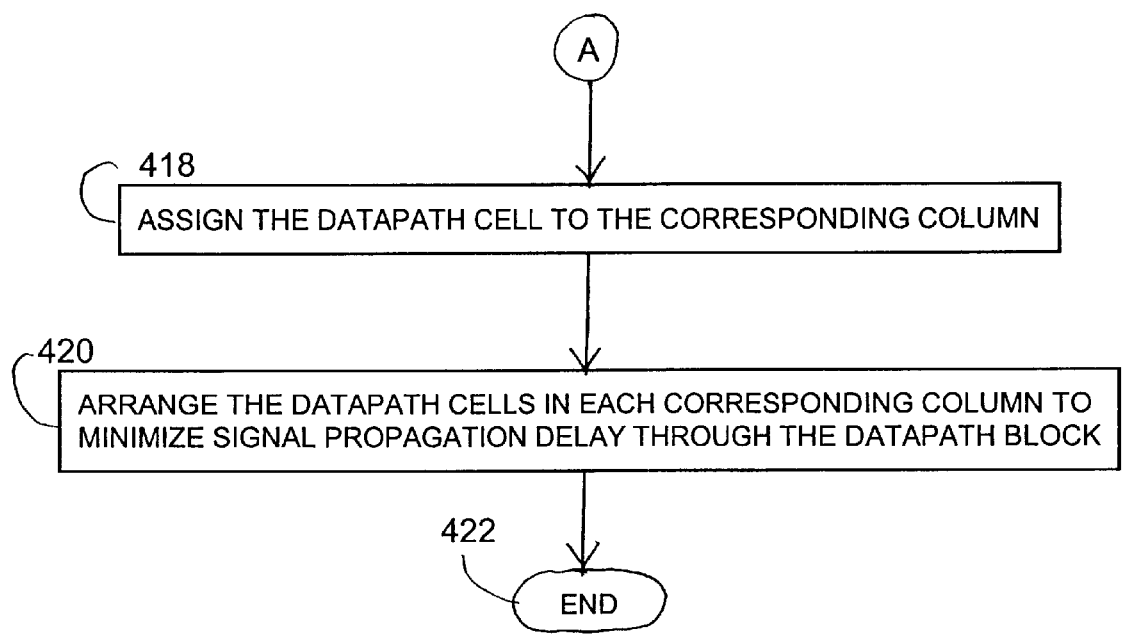

FIGS. 4A and 4B are a flowchart 400 of a method of datapath cell placement summarizing the steps described above according to an embodiment of the present invention.

Step 402 is the entry point of the flowchart 800.

In step 404, a datapath description of datapath cells, data input pins, data output pins, and control signal input pins is received as input.

In step 406, the data input pins and data output pins are sorted according to a hierarchy of sorting criteria.

In step 408, a criticality value is determined for each datapath cell.

In step 410, the datapath cells are sorted according to their corresponding values of criticality.

In step 412, a check is made as described above to determine whether the datapath design is bitwise or non-bitwise.

In step 414, if the datapath design is bitwise, a corresponding column for each datapath cell is determined by the pin constraint of a constrained cluster pin connected directly to a candidate datapath cell.

In step 416, if the datapath design is nonbitwise, a corresponding column is determined by selecting the candidate column having a minimum weighted sum of column height and total distance between the candidate column and other columns corresponding to constrained cluster pins to which the datapath cell is directly connected. For datapath cells connected directly to constrained cluster pins, the candidate columns are those columns corresponding to the constrained cluster pins. For datapath cells that are not connected directly to constrained cluster pins, the candidate columns are the columns between the minimum and maximum column constraints.

In step 418, each datapath cell is assigned to the corresponding column selected in step 414 or step 416.

In step 420, the datapath cells in each column partition are arranged to minimize signal propagation delay through the datapath block.

Step 422 is the exit point for the flowchart 800.

The method of datapath cell placement described above may advantageously be used to minimize signal propagation time through a datapath macro as well as datapath macro area.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of datapath cell placement comprising the steps of:

receiving as input a datapath description for a datapath block wherein the datapath description describes at least one of a plurality of datapath cells, a plurality of data input pins, a plurality of data output pins, and a plurality of control signal pins;

(a) sorting the plurality of data input pins and the plurality of data output pins according to a hierarchy of sorting criteria;

(b) determining a plurality of corresponding criticality values for the plurality of datapath cells;

(c) sorting the plurality of datapath cells according to the corresponding values of criticality;

(d) assigning the plurality of datapath cells to a plurality of corresponding columns; and (e) arranging the plurality of datapath cells within at least one of the plurality of corresponding columns to minimize signal propagation delay through the datapath block wherein the hierarchy of sorting criteria in step (a) includes a path length constraint, a column constraint, and a side constraint.

2. The method of claim 1 wherein the path length is obtained by traversing a logical net along a corresponding signal propagation path in either a forward direction or a backward direction.

3. A method of datapath cell placement comprising the steps of:

receiving as input a datapath description for a datapath block wherein the datapath description describes at least one of a plurality of datapath cells, a plurality of data input pins, a plurality of data output pins, and a plurality of control signal pins;

(a) sorting the plurality of data input pins and the plurality of data output pins according to a hierarchy of sorting criteria;

(b) determining a plurality of corresponding criticality values for the plurality of datapath cells;

(c) sorting the plurality of datapath cells according to the corresponding values of criticality;

(d) assigning the plurality of datapath cells to a plurality of corresponding columns; and (e) arranging the plurality of datapath cells within at least one of the plurality of corresponding columns to minimize signal propagation delay through the datapath block wherein step (d) includes selecting a plurality of possible candidate columns for at least one of the plurality of datapath cells wherein each of the plurality of possible candidate columns corresponds to a constrained one of the plurality of data input pins and the plurality of data output pins directly connected to the at least one of the plurality of datapath cells.

4. The method of claim 3 wherein step (d) includes calculating for at least one of the plurality of possible candidate columns a weighted sum of a column height and a total distance between the at least one of the plurality of possible candidate columns and at least one other column corresponding to a constrained one of the plurality of data input pins and the plurality of data output pins to which the at least one of the plurality of datapath cells is directly connected.

5. The method of claim 4 wherein step (d) includes selecting one of the plurality of possible candidate columns as the corresponding column wherein the weighted sum for the selected one of the possible plurality of candidate columns is a minimum.

6. A method of datapath cell placement comprising the steps of:

receiving as input a datapath description for a datapath block wherein the datapath description describes at least one of a plurality of datapath cells, a plurality of data input pins, a plurality of data output pins, and a plurality of control signal pins;

(a) sorting the plurality of data input pins and the plurality of data output pins according to a hierarchy of sorting criteria;

(b) determining a plurality of corresponding criticality values for the plurality of datapath cells;

(c) sorting the plurality of datapath cells according to the corresponding values of criticality;

(d) assigning the plurality of datapath cells to a plurality of corresponding columns; and (e) arranging the plurality of datapath cells within at least one of the plurality of corresponding columns to minimize signal propagation delay through the datapath block wherein step (d) includes selecting as the corresponding column a column corresponding to a constrained one of the plurality of data input pins and the plurality of data output pins that is directly connected to one of the plurality of datapath cells.

7. The method of claim 6 wherein step (d) includes selecting as the corresponding column a column corresponding to a constrained one of the plurality of data input pins and the plurality of data output pins that is directly connected to a corresponding candidate datapath cell that lies in a path between the one of the plurality of datapath cells and the constrained one of the plurality of data input pins and the plurality of data output pins.

8. A method of datapath cell placement comprising the steps of:

receiving as input a datapath description for a datapath block wherein the datapath description describes at least one of a plurality of datapath cells, a plurality of data input pins, a plurality of data output pins, and a plurality of control signal pins;

(a) sorting the plurality of data input pins and the plurality of data output pins according to a hierarchy of sorting criteria;

(b) determining a plurality of corresponding criticality values for the plurality of datapath cells;

(c) sorting the plurality of datapath cells according to the corresponding values of criticality;

(d) assigning the plurality of datapath cells to a plurality of corresponding columns; and (e) arranging the plurality of datapath cells within at least one of the plurality of corresponding columns to minimize signal propagation delay through the datapath block wherein if two or more of the plurality of datapath cells have an identical corresponding criticality value, then the two or more of the plurality of datapath cells are ordered in an order identical to two constrained cluster pins along shortest corresponding signal propagation paths of the two or more of the plurality of datapath cells.

9. A method of datapath cell placement comprising the steps of:

receiving as input a datapath description for a datapath block wherein the datapath description describes at least one of a plurality of datapath cells, a plurality of data input pins, a plurality of data output pins, and a plurality of control signal pins;

(a) sorting the plurality of data input pins and the plurality of data output pins according to a hierarchy of sorting criteria;

(b) determining a plurality of corresponding criticality values for the plurality of datapath cells;

(c) sorting the plurality of datapath cells according to the corresponding values of criticality;

(d) assigning the plurality of datapath cells to a plurality of corresponding columns; and (e) arranging the plurality of datapath cells within at least one of the plurality of corresponding columns to minimize signal propagation delay through the datapath block wherein step (d) includes determining whether at least one of the plurality of datapath blocks has a bitwise design.

10. The method of claim 9 further comprising:

selecting an input logical pin bus having a maximum size;

traversing pins of the input logical pin bus in a forward direction to a plurality of data output logical pins;

if the plurality of data output logical pins form a bus in an identical or reverse order, then determining that the at least one of the plurality of datapath blocks has a bitwise design, otherwise determining that the at least one of the plurality of datapath blocks has a non-bitwise design.

* * * * *